United States Patent [19]

Newman

[11] 4,338,595

[45] Jul. 6, 1982

[54] MICROWAVE LEAKAGE DETECTOR

[75] Inventor: Daniel D. Newman, Los Angeles, Calif.

[73] Assignee: Microwave Radiation Dector Corporation, Landover, Md.

[21] Appl. No.: 185,880

[22] Filed: Sep. 9, 1980

[51] Int. Cl.³ .............................................. G08B 21/00
[52] U.S. Cl. .................................... 340/600; 250/250; 315/134; 343/703; 340/635
[58] Field of Search ............... 340/600, 635; 455/226, 455/620; 315/134, 150; 250/250; 307/117; 343/703

[56] References Cited

U.S. PATENT DOCUMENTS 3,173,091  3/1965  Strull .................................. 340/600
3,828,251  8/1974  Webb ................................... 324/72
3,927,375  12/1975  Lanoe et al. ........................ 340/600
4,032,910  6/1977  Hollway et al. .................... 340/600
4,253,092  2/1981  Connah, Jr. ........................ 340/600

Primary Examiner—Glen R. Swann, III
Attorney, Agent, or Firm—Samuel Meerkreebs

[57] ABSTRACT

A portable microwave leakage detector comprises a dipole antenna and a hot carrier diode connected in parallel with a light emitting diode, the circuit incorporating minimum solder joints and affording maximum sensitivity without moving parts such that the detector circuit does not decay with time. The dipole antenna is oriented diagonally in a detector case so that the user of the detector automatically presents the antenna to the radiating microwave field (or leakage field) at a maximum receiving attitude with respect to the field. The detector can be utilized to determine whether a microwave oven or any other device is leaking radiation beyond limits imposed by the Food and Drug Administration.

10 Claims, 7 Drawing Figures

U.S. Patent    Jul. 6, 1982    4,338,595
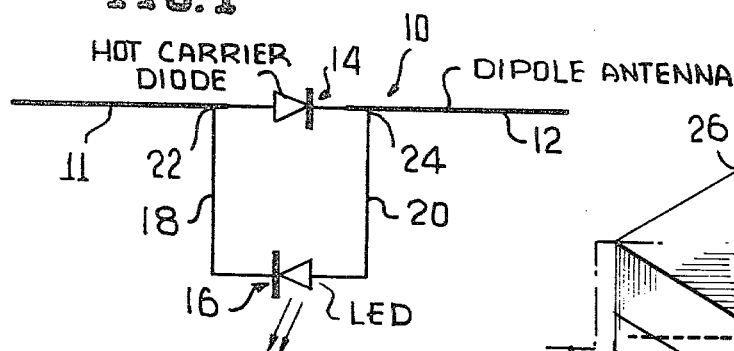
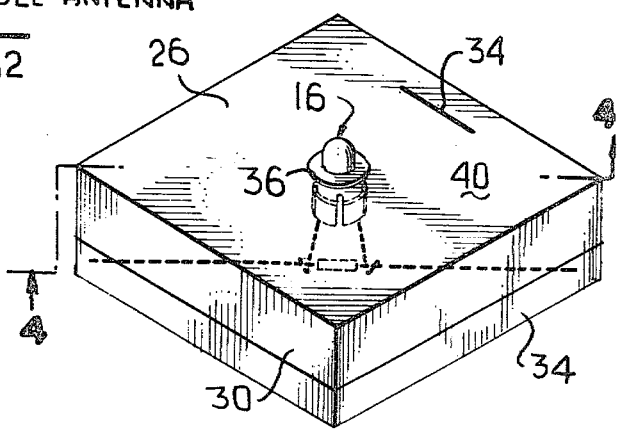
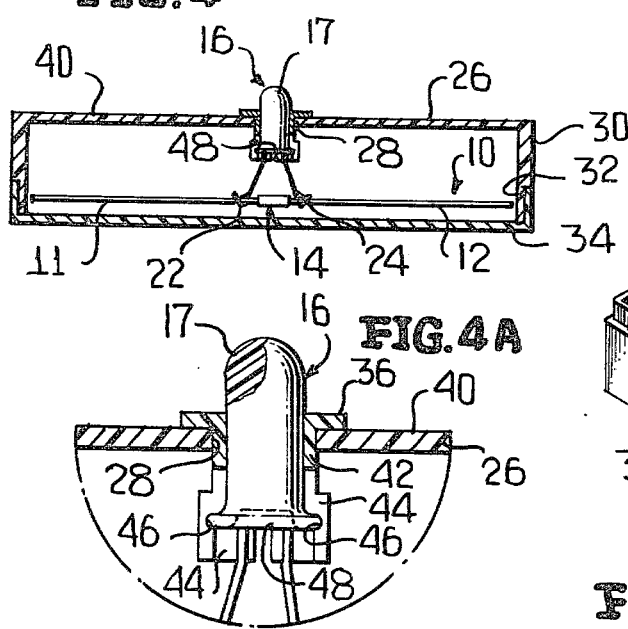
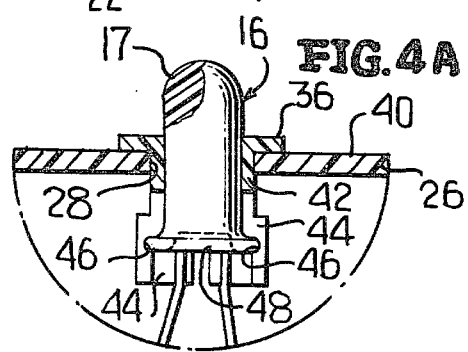
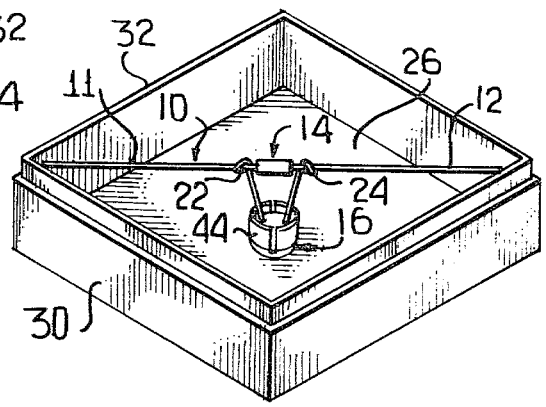
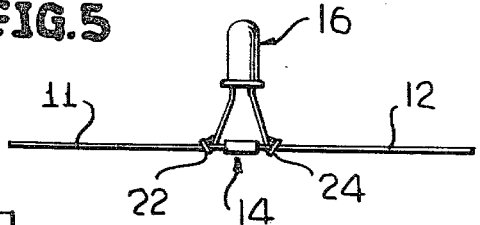
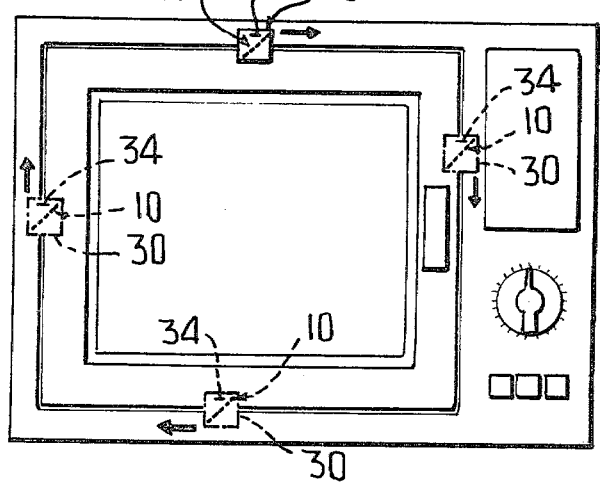

MICROWAVE LEAKAGE DETECTOR

BACKGROUND OF THE INVENTION

Because of the potential danger presented by being exposed to continuous, albeit small microwave fields generated by microwave energy passing through deteriorated microwave oven doors, police radar speed monitors, telephone and television relay stations, diathermy machines, wood or rubber curing plants emitting microwave fields, it is imperative that this energy be monitored. To effectuate this purpose, a simple and efficient monitoring expedient should be conveniently available at the site of use. This is particularly important with respect to microwave ovens, since the seals and shoulders used to prevent the microwave energy from escaping into the household environment progressively deteriorates such that a once-safe oven gradually emits more and more energy into the environment to the detriment of the people in the vicinity of such an oven. Therefore, a detector is needed which enables a user to quickly and easily determine the presence of such a leak in the home, factory or commercial establishments before any harm occurs.

Various microwave power detectors have been developed for this purpose. One such detector has been described in U.S. Pat. No. 4,032,910 issued to Hollway et al. This patent discusses a detector which includes a dipole antenna, a hot carrier diode and a light emitting diode used to indicate whether the detector senses a microwave field greater than a predetermined value. As shown in FIG. 3 of Hollway et al, an antenna is placed across a hot carrier diode. A silicon controlled rectifier is connected in series with an audio or visual alarm such as an LED which is triggered by a signal level derived from a potential divider connected across the hot carrier diode. However, while this particular circuit is relatively simple, the number of solder connections is such that current losses are greater than if a smaller number of solder connections, such as two, were utilized. Additionally, no provision is made in the Hollway et al patent for ensuring that the dipole antenna is oriented properly with respect to the source of microwave energy. With respect to leakages around microwave oven doors, relatively small amounts of energy must be detected. For instance, the Food and Drug Administration promulgated regulations on Oct. 6, 1971 which indicated that the maximum level of acceptability for radiation emitting from a microwave oven would be five milliwatts of microwave energy per square centimeter measured at five centimeters (two inches) from the oven surface. Therefore, since such small amounts of radiation are involved, it is imperative that the dipole antenna be correctly oriented with respect to the source of the radiation. If this is not the case, a detector might incorrectly indicate that a particular microwave oven is not radiating an unacceptable amount of microwave energy, when this is not the case. Furthermore, the device described in the Hollway et al patent can be tested for operability only by placing it into a beaker of water within the microwave oven. This manner of testing is inherently dangerous, by subjecting the user to radiation, possibly damaging or burning the cornea of the eye.

Other patents such as U.S. Pat. Nos. 3,173,091 issued to Strull; 3,828,251 issued to Webb; and 3,927,375 issued to Lanoe et al describe microwave detector devices which suffer from some of the disadvantages described with respect to the Hollway et al patent.

SUMMARY OF THE INVENTION

In accordance with the present invention, a microwave energy leakage detector is provided which is portable and easy for a non-technical individual to properly utilize. The detector includes a dipole antenna and a hot carrier diode connected in parallel with an LED. Due to the simplicity of the circuit, only two solder joints connect the LED across the hot carrier diode. The circuit is provided within a detector case in such a manner that during use, the antenna is automatically provided at the proper orientation for maximum reception of the microwave energy. The antenna length and the particular LED employed are dependent on the sensitivity desired and the intensity of the leak-source. Additionally, due to the simplicity of the circuit, only two solder joints are needed, thereby insuring a minimum current leakage and thereby a maximum transmittal of DC current to the LED and excellent LED sensitivity. Furthermore, the simplicity of the circuit enables the circuit including the antenna to be easily and efficiently mounted within the detector case.

DESCRIPTION OF THE DRAWING

FIG. 1 is the basic circuit diagram of the portable microwave detector;

FIG. 2 is a perspective view of the detector;

FIG. 3 is an inverted perspective view of the detector showing the dipole antenna assembled in the face plate of the detector case;

FIG. 4 is a diagonal section taken on the plane of line 4—4 of FIG. 3, illustrating how the dipole antenna, hot carrier antenna and LED are mounted in an operative position within the detector case;

FIG. 4A is an enlarged view of mounting the circuit within the face plate;

FIG. 5 is a plan view of the dipole antenna and LED assembled and prior to installation in the instrument case; and FIG. 6 illustrates diagrammatically how the seals of a microwave door housing are tested, and the orientation of the 45° dipole at all attitudes.

DESCRIPTION OF A PREFERRED EMBODIMENT

Referring to FIG. 1, the circuit utilized by the present invention consists of a dipole antenna 10 including oppositely extending, axially aligned antenna arms 11 and 12 connected in series with a hot carrier diode 14. An LED 16 is connected in parallel with the diode 14 by leads 18 and 20 by means of single solder connections 22 and 24, respectively, in flanking relation to the hot carrier diode 14. In the presence of a microwave energy field the hot carrier diode 14 converts alternating current to direct current sufficiently to energize the LED 16. Although not important to this invention, the antenna 10 can be constructed of copper with a silver or tin plating, and the conductor leads 18 and 20 could be constructed of various conducting materials.

FIG. 5 illustrates the sensing means of the detector described in FIG. 1. For better indication of the presence of microwave radiation, the LED is encapsulated in a colored hard plastic container 17; see FIG. 4A. Additionally, this container facilitates the insertion and mounting of the sensing means within the detector case.

As shown in FIGS. 2, 3 and 4, the case comprises a mounting plate 26 which is centrally apertured at 28. Although the exact size and shape of the detector casing is not essential, the present invention utilizes a square mounting plate measuring two inches on each side, and includes a bounding wall 30 of suitable depth to accommodate the mounted subassembly of FIG. 5. The wall 30 also includes a terminal, inwardly set lip 32, which telescopically accommodates thereover a cover plate 34. The housing is produced from a suitable molded plastic, and although circular, elliptical or oval shaped casings are possible within the scope of the invention, a square or rectangular housing has the unusual function of insuring that the dipole antenna is properly mounted within the detector casing allowing proper orientation of the case during usage by a relatively unskilled person.

The base plate 26 accommodates therein a grommet 36 in which an apertured abutment lies flush on the outer surface 40 of the plate 26. The grommet includes a tubular sleeve 42 having a plurality of spring-fingers 44 defined by an intermediate, circumferential groove segment 46 forming an abutment to retain the grommet in the aperture 28 against normal longitudinal displacement. The groove segments 46, on their inwardly facing side, form notches (see FIG. 4A) which accomodate a lower peripheral rib 48 formed on the lower edge of the encapsulation 17 of the LED. When the LED is inserted into the sleeve 42, the spring-fingers 44 are displaced outwardly, thus the rib of the LED can lock into the notch segments 46 while the terminal end of the LED projects beyond the abutment of the grommet and is exposed for viewing at the outer surface 40 of the detector.

The dipole antenna will be disposed diagonally between opposite corners of the instrument when assembly has been achieved, i.e., at 45° to the horizontal edges of the upper and lower edges of the casing. This is the position of use of the detector as is illustrated diagrammatically in FIG. 6 whereby it is used to sense the radiation level produced by a source having at least two surfaces perpendicular with respect to one another, such as a microwave oven. Although perhaps maximum sensitivity might be obtained if the dipole antenna were at right angles to the horizontal and vertical seals of an oven door, for example, placement of the linear antenna at 45° to both the horizontal and vertical seal lines of a microwave oven eliminates the necessity for rotating the instrument case, and affords sufficient sensitivity of the detector to pick up a signal greater than a prescribed minimum. It should be noted that all the radiated power will be transferred to the receiving load only when the load impedance presents a conjugate match to the antenna impedance. For any other match condition, the transferred power will be smaller by the mismatch loss factor.

The method of use of the above described microwave detector will be illustrated. With the detector case oriented in the manner shown in FIG. 6, providing the dipole antenna is at a 45° angle with respect to the microwave oven seals, the detector is placed directly against the oven door. The users are assured that the detector case is properly oriented by providing indicia 34 on the case indicating the correct orientation of the detector with respect to the radiation source, the microwave oven seals. Since all of the microwave ovens presently marketed leak radiation to some degree, the LED will light indicating that the detector is properly functioning. The detector is now moved approximately four inches from the oven door and is made to circumvent the perimeter door in the manner and orientation shown in FIG. 6. If the LED is still activated at this distance, an excessive leakage condition is occuring whereby the amount of radiation emanating from the oven is greater than that permitted by FDA standards. Additionally, since the light produced by the LED varies with respect to the strength of the radiation field, the position of the worst area of leaks can be determined.

As indicated hereinabove, by changing the length of the dipole or the value of the diodes used would change the threshold value of the sensed radiation, as well as the distance the detector should be placed away from the oven seals to determine leakage. For example, the longer the antenna, the greater the sensitivity of the detector. Furthermore, the precise configuration of the detector case is not important except to its ability to allow the user to properly position the dipole antenna. This is important since the orientation of the antenna with respect to the radiation field is important in producing accurate results. For example, as the antenna is rotated with respect to the field, the ability to receive and reflect the presence of the field is altered, to such an extent that if the dipole antenna were parallel to the leak seal, no signal at all would be generated.

It will be appreciated that the specific details of the embodiment or its environment of use are merely exemplary and that further modifications and variations in addition to those described can be effected in this embodiment without departing from the scope and spirit of the invention.

What is claimed is:
1. A microwave radiation detector comprising:
   a detector casing;
   sensing means provided in said casing for sensing radiation;
   display means connected to said sensing means for indicatng the presence of radiation; and
   means orienting said detector for insuring that the maximum amount of radiation emanating from a particular source is sensed by said sensing means, said sensing means and said display means containing only two electrical connections.
2. A microwave radiation detector in accordance with claim 1 wherein said sensing means comprises a dipole antenna and said display means includes a hot carrier diode connected in parallel with an LED, and whereby said dipole antenna is connected in series with said hot carrier diode.
3. A microwave radiation detector in accordance with claim 1 wherein said orienting means includes indicia provided on the face of said detector casing.
4. A microwave radiation detector in accordance with claim 2 or 3 wherein said detector casing contains a rectangular face plate and said dipole antenna extends diagonally of said face plate.
5. A microwave radiation detector comprising:
   sensing means for sensing radiation; and
   display means connected to said sensing means for indicating the presence of radiation, said sensing and said display means containing only two electrical connections.
6. A microwave radiation detector in accordance with claim 5 wherein said sensing means comprises a dipole antenna and said display means includes a hot carrier diode connected in parallel with an LED, said dipole antenna being connected in series with said hot carrier diode.

7. A microwave radiation detector in accordance with claim 5 including means orienting said sensing means in an attitude insuring that the maximum amount of radiation emanating from a particular source is sensed by said sensing means.

8. A microwave radiation detector in accordance with claim 7 further including a detector casing within which said sensing means and said display means are provided.

9. A microwave radiation detector in accordance with claim 8 wherein said orienting means includes indicia provided on a face of said detector casing.

10. A microwave radiation detector in accordance with claim 9 where in said detector casing contains a rectangular face plate, said sensing means consisting of a dipole antenna, and said dipole antenna extending diagonally with respect to said rectangular face plate.

* * * * *